US007688665B2

(12) United States Patent  (10) Patent No.: US 7,688,665 B2
Kim et al.  (45) Date of Patent: Mar. 30, 2010

(54) STRUCTURE TO SHARE INTERNALLY GENERATED VOLTAGES BETWEEN CHIPS IN MCP

(75) Inventors: Jung Pill Kim, Cary, NC (US); Jong Hoon Oh, Chapel Hill, NC (US); Oliver Kiehl, Charlotte, VT (US); Josef Schnell, Charlotte, VT (US); Klaus Hummler, Apex, NC (US); Wayne Frederick Ellis, Jericho, VT (US); Octavian Beldiman, South Burlington, VT (US); Lee Ward Collins, Cary, NC (US)

(73) Assignee: Qimonda North America Corp., Cary, NC (US)

( * ) Notice: Subject to any disclaimer, the term of this patent is extended or adjusted under 35 U.S.C. 154(b) by 184 days.

(21) Appl. No.: 11/860,977

(22) Filed: Sep. 25, 2007

(65) Prior Publication Data

US 2009/0080279 A1  Mar. 26, 2009

(51) Int. Cl.
  *G11C 5/14* (2006.01)
(52) U.S. Cl. .............. 365/226; 365/189.09; 365/189.02
(58) Field of Classification Search ................. 365/226, 365/189.09, 189.02, 185.18, 191, 189.03
  See application file for complete search history.

(56) References Cited

U.S. PATENT DOCUMENTS

| 6,282,130 | B1 * | 8/2001 | Cernea et al. .......... 365/189.09 |
| 6,434,044 | B1 * | 8/2002 | Gongwer et al. ....... 365/185.18 |
| 2001/0003373 | A1 * | 6/2001 | Akram ...................... 257/678 |
| 2006/0077723 | A1 * | 4/2006 | Gruber et al. .......... 365/189.04 |

* cited by examiner

*Primary Examiner*—Dang T Nguyen
(74) *Attorney, Agent, or Firm*—Patterson & Sheridan, L.L.P.

(57) ABSTRACT

Embodiments of the invention generally provide an apparatus and technique for sharing an internally generated voltage between devices of a multi-chip package (MCP). The internally generated voltage may be shared via a conductive structure that electrically couples the devices and carries the internally generated voltage.

17 Claims, 4 Drawing Sheets

US 7,688,665 B2

STRUCTURE TO SHARE INTERNALLY GENERATED VOLTAGES BETWEEN CHIPS IN MCP

BACKGROUND OF THE INVENTION

Description of the Related Art

Multi-chip packages (MCPS) are individual semiconductor packages, made of plastic or ceramic, containing two or more die connected internally with wire-bonding. MCPs allow multiple devices to be integrated into a single, more compact, package with the same footprint on a printed circuit board (PCB) as a single chip device. MCPs typically contact the PCB with pins, such as solder balls or other type of conductive elements.

The multiple die within the MCP each have various circuits supplied with power externally, via the pins, and also internally by means of internal voltage generators. The circuitry that produces internally generated voltages like Vpp, Vbb, and VBLH often includes Deep Trench buffer capacitors (DT caps). Buffer capacitors aid in the stabilization of the output voltage. Traditionally, buffer capacitors are added to each voltage generating circuit.

SUMMARY OF THE INVENTION

The present invention generally provides a method and articles of manufacture providing an electrical coupling between the internal voltage generated on one device of a multi-chip package and a plurality of other devices found within the same MCP. Electrically coupling a plurality of chips within a MCP provides increased voltage stability while decreasing the die space used.

Embodiments of the invention further provide a multi-chip package that includes a conductive interconnect electrically coupling an internal voltage generator found on at least one device within a multi-chip package with a plurality of other devices found within the same multi-chip package, allowing the voltage generated on one device to be shared between the plurality of devices.

Embodiments of the invention further provide a multi-chip package that includes a conductive interconnect electrically coupling an internal voltage generator found on at least one memory device within a multi-chip package with a plurality of other memory devices found within the same multi-chip package, allowing the voltage generated on one memory device to be shared between the plurality of memory devices.

Embodiments of the invention further provide a method for sharing an internally generated voltage between several devices within a multi-chip package (MCP). The method includes generating a voltage within a device of a MCP and providing the generated voltage to one or more different devices within the MCP by means of an interconnect structure.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide an apparatus and technique for sharing an internally generated voltage between devices of a multi-chip package (MCP). The internally generated voltage may be shared via a conductive structure that electrically couples the devices and carries the internally generated voltage. By sharing an internally generated voltage in this manner, voltage generators on different devices within the MCP may share buffer capacitors, which may provide improved voltage stability while utilizing less area on each die. Further, electrically coupling the output of multiple voltage generators may, in some cases, provide increased drive.

Example embodiments will be described with reference to MCPs having one or more memory devices that share common internally generated voltages. However, those skilled in the art will recognize that the techniques described herein may be applied to share internally generated voltages between a variety of different type devices of an MCP.

An Example Multi-Chip Package (MCP)

Figure 1:
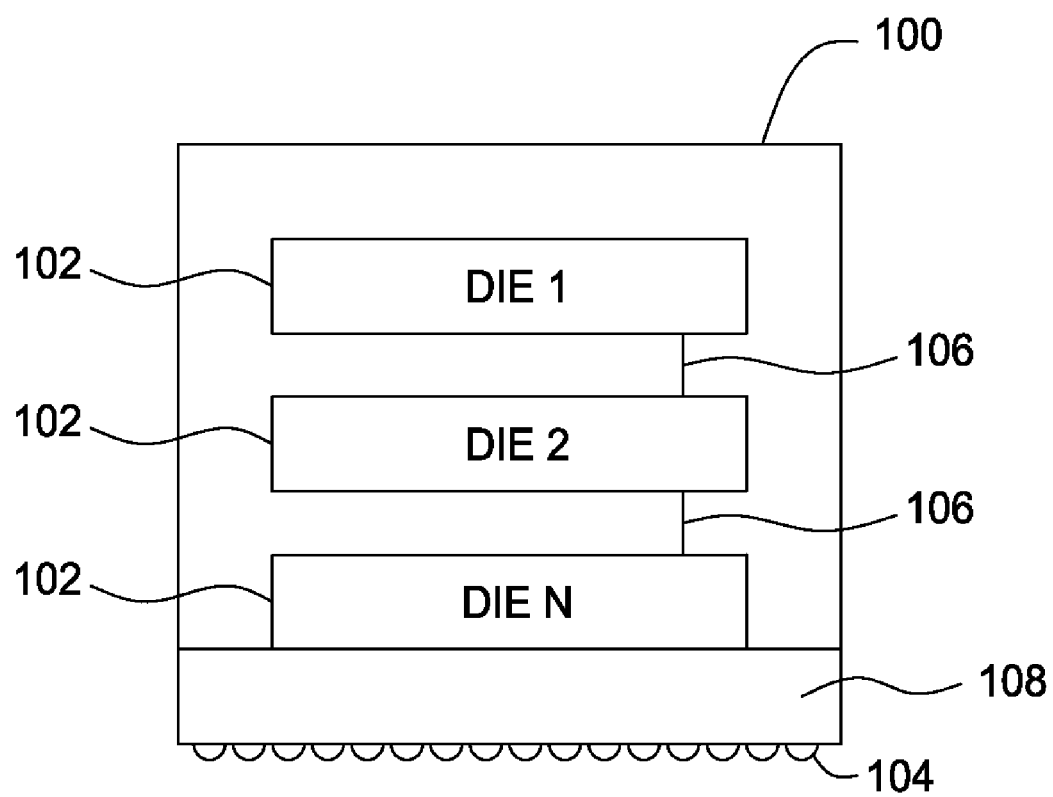
FIG. 1 is an example of a multi-chip package with multiple stacked die.

FIG. 1 shows an example multi-chip package (MCP) 100, with multiple devices, shown as semiconductor die 1-N 102. The MCP may utilize wiring, micro bumps, or via holes to connect one die to another via a substrate 108. The substrate 108 may route signals as appropriate to interconnect the devices 102. Solder balls 104 or some other type of external lead provide external connection, for example, to a PCB.

Depending on the particular embodiment, different combinations of devices with the same or different functions may be used. For example, the devices may perform processing or logic functions, and may include one or more memory devices. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

In both situations, where the memory is integrated into a device with other circuits and where the memory is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, embodiments of the invention may be used with multiple types of memory or with a memory which is included on a device with multiple other types of memory. The memory types may include volatile memory and non-volatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (Fe-RAM), phase-change RAM (PRAM), electrically erasable programmable read-only memory (EEPROM), laser programmable fuses, electrically programmable fuses (e-fuses), and any other types of nonvolatile memory.

Regardless of the particular functionality, each device will typically utilize include circuitry to generate one or more internal voltages. For example, for memory devices, these internal voltages may include, but are not limited to, voltages such as Vpp (an arbitrary internally generated high voltage), Vbb (substrate voltage), and VBLH (Voltage Bit Line High). Internal voltage generators are used to provide other circuits, within the same device, stable voltages besides those provided externally such as an external power supply and ground. In many instances, a Deep Trench buffer capacitor is used to aid in stabilizing the internally generated voltage.

Sharing Internally Generated Voltages

In some embodiments, multiple die will have circuitry generating the same internal voltage. In such embodiments, a conductive interconnect 106 may be used to share an internally generated voltage between multiple devices 102 of the MCP. The sharing of an internally generated voltage may increase voltage generator stability, while decreasing the amount of die space used, for example, for buffer capacitors.

The interconnect 106 may span the devices and be formed using any suitable techniques and materials. For example, for one embodiment, the interconnect 106 may be formed with vias or plated through-holes (PTH) formed in layers that separate the devices. Each device that is sharing an internally generated voltage may have a conductive element (e.g., an external pad) that contacts the via or PTH.

For some embodiments, one or more of the devices may not even have a voltage generator for a shared voltage, relying solely on another device to provide the voltage. In other words, the interconnect 106 may be used to allow the internal voltage generator of a single die to provide a given voltage to a plurality of die. Such a utilization of an interconnect may limit unnecessary redundancies in generating a given voltage on each individual die and reduce the amount of total die space being used to generate internal voltages.

Figure 2:
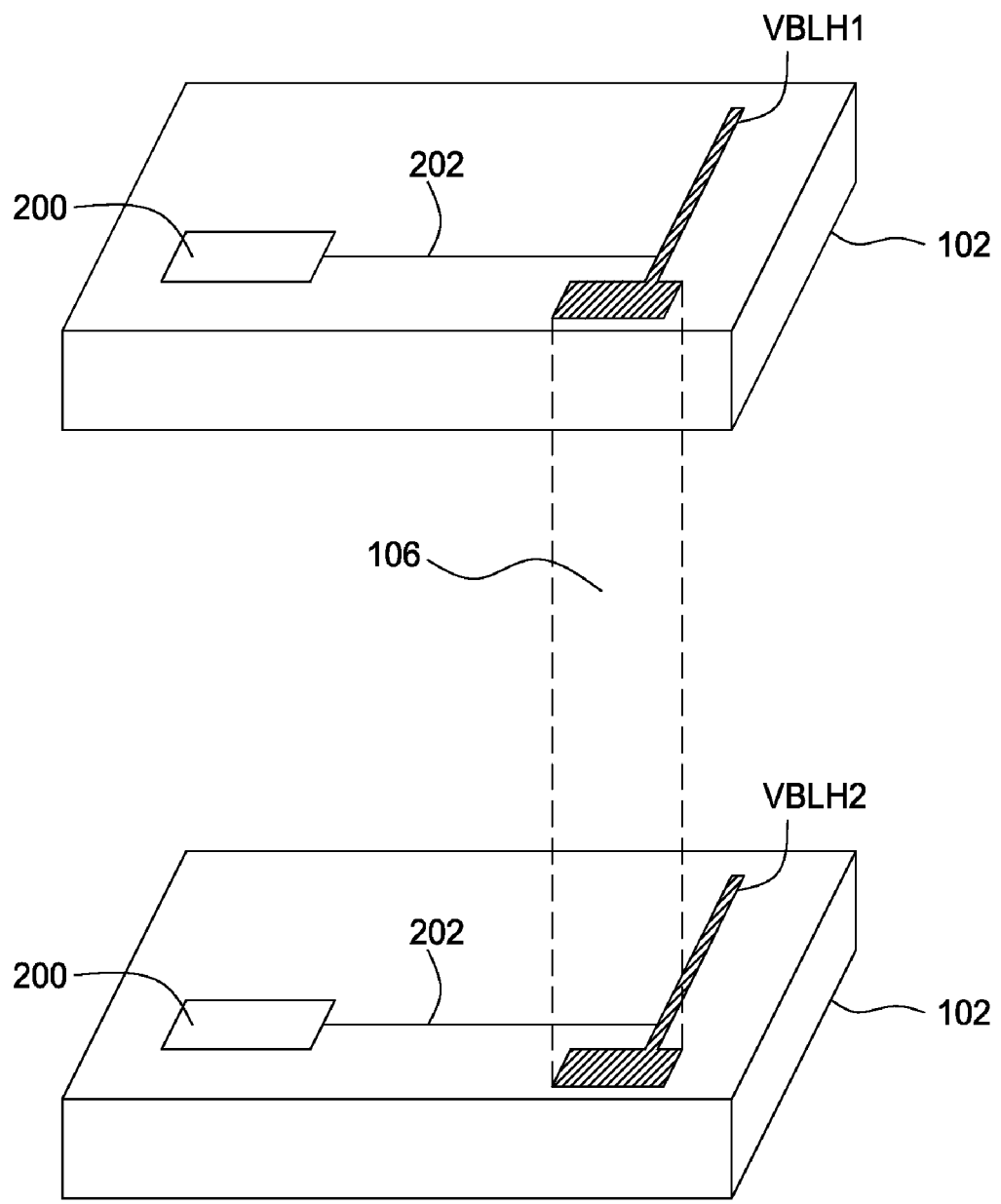
FIG. 2 is an example of dual stacked die found within an MCP.

FIG. 2 illustrates one example application, in which an internally generated VBLH voltage is shared between memory devices of an MCP. In this example, the MCP 100 includes two separate DRAM devices 102, each with a VBLH generator 200. Each VBLH generator produces a voltage that is present on conductive traces 202 and is connected to each other via interconnect 106. Benefits of such an embodiment may include a more stable voltage for any or all loads when compared to individual internal voltage generators isolated on each die or smaller circuits to provide the same voltage stability resulting in the utilization of less die area.

Voltage stability of a VBLH voltage may be particularly important, as even small fluctuations may result in erroneous readings when comparing the voltage across the capacitor of a memory cell during a memory array access. By sharing the internally generated VBLH, the size of buffer capacitors of the VBLH generators 200 may be reduced, while maintaining stability, as the capacitors, in effect, are connected in parallel, resulting in a summation of the capacitance of each generator 200.

Figure 3:
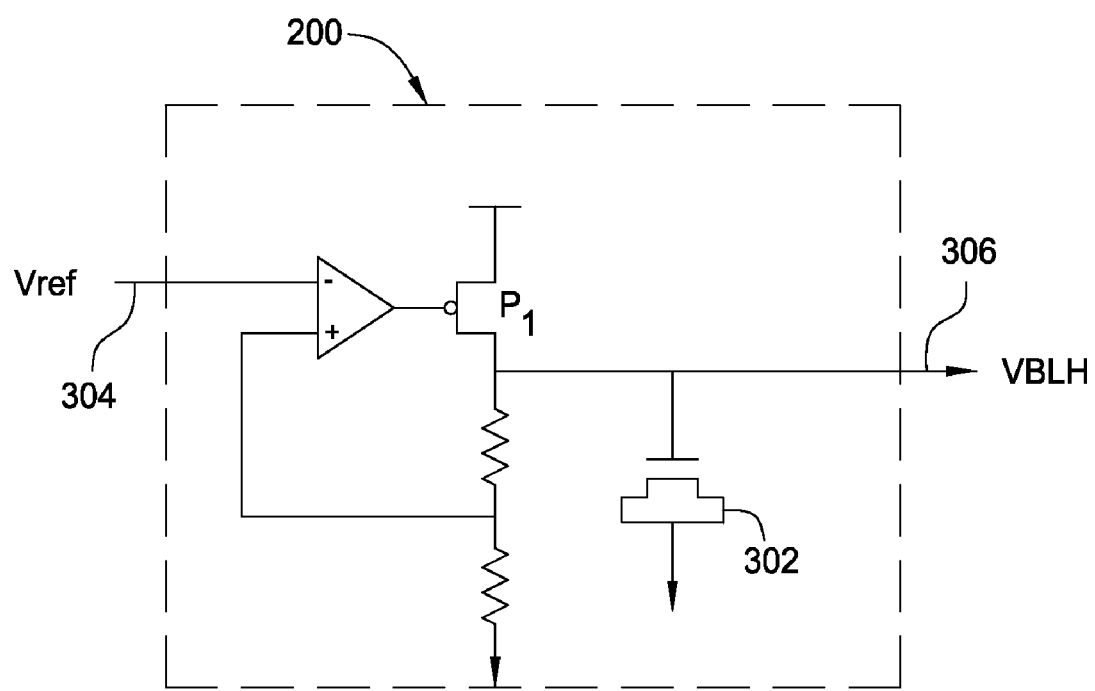
FIG. 3 is an example of an internal voltage generator.

FIG. 3 illustrates one example of the internal voltage generator 200 of FIG. 2. Within the voltage generator is a circuit for producing an internal voltage, although someone skilled in the art may implement a number of different circuits that are equivalent in function to the one shown. It also shows a large deep trench (DT) buffer capacitor 302 to maintain the output of the voltage generator and increase the stability of the generator. In conventional MCPs that do not share internally generated voltages, large DT buffer capacitors are required on each chip (as the capacitor on each device is isolated from the others). The internal voltage generator outputs a stable internal voltage, for example VBLH, along a conductive trace 306.

Figure 4:
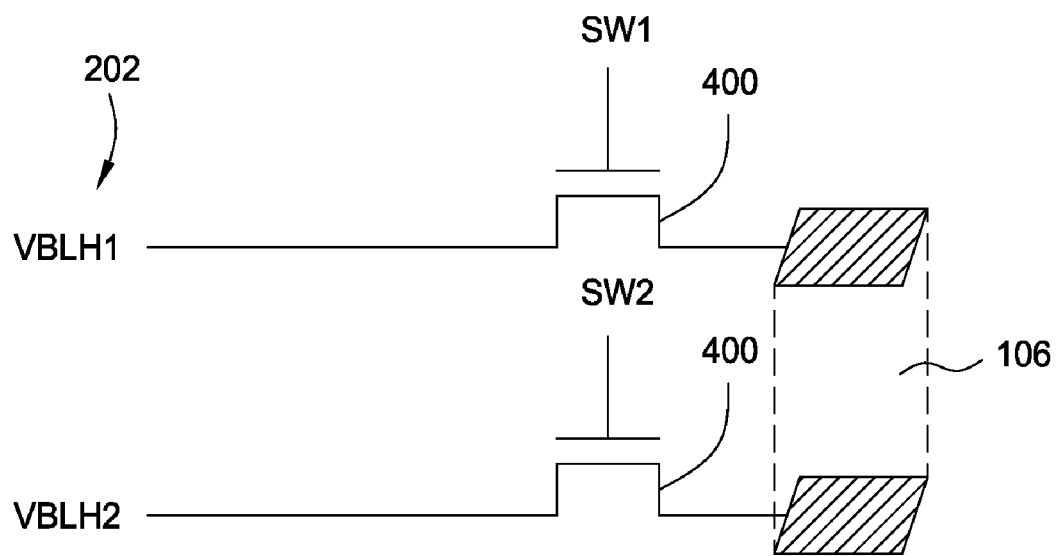
FIG. 4 is an example of a means for selectively disconnecting an internal voltage generator.

In some embodiments, a switch 400 on one or more of the die, as shown in FIG. 4, may allow for selective coupling of an internally generated voltage to a shared interconnect. The switch may be placed between the voltage generator, DT buffer capacitor, and the load and an interconnect 106 and serve as a means to disconnect all voltage generator components, or other elements along conductive trace 202 from the interconnect 106.

In some embodiments, these switches may also separate the voltage generator and buffer capacitor from the load or separate the voltage generator from the buffer capacitor and load. The implementation of such switches may provide a designer with an ability to select which die, load, buffer capacitor, voltage generator, or combination thereof, which may be located on a plurality of die, is connected to the network of other die at a given time.

The ability to select which of several components are connected within a multi-chip package further provides the designer with the ability to control other characteristics of the package as a whole. For example, a designer may control a degree of the voltage stability by using the switches to connect one or more buffer capacitors to the network of other die. Further, a designer may control the amount of power being consumed by switching off unnecessary or less critical load on one or more die.

In some embodiments various logic circuits or controllers may be implemented to provide selective switching. For example, for some embodiments, a device may be switched to a shared interconnect only when that device is selected. As an alternative, for some embodiments a more complex switching arrangement may be provided, for example, allowing the capacitor of a device to be shared, while disconnecting its other circuits from the shared interconnect. As a result, the capacitor of that device may contribute to increased stability of the shared voltage, without increasing the load driven thereby.

While the foregoing is directed to embodiments of the present invention, other and further embodiments of the invention may be devised without departing from the basic scope thereof, and the scope thereof is determined by the claims that follow.

What is claimed is:

1. A multi-chip package (MCP), comprising:
a plurality of devices;
a first internal voltage generator located on at least one of the devices and designed to generate a first voltage signal from a voltage signal supplied to an external pad of the MCP;
an interconnect structure spanning the plurality of devices and allowing the first voltage signal to be shared between the plurality of devices; and
a switch on at least one of the devices allowing selective coupling of one or more traces to the interconnect structure.

2. The multi-chip package of claim 1, further comprising:
control logic to generate a control signal to disconnect the one or more traces for one of the devices from the interconnect structure when the one device is not selected.

3. The multi-chip package of claim 1, wherein:
each device has an internal voltage generator with a capacitor to maintain a voltage generated thereby; and
the interconnect structure forms a parallel connection between the capacitors resulting in a summing of the corresponding capacitance.

4. The multi-chip package of claim 1, wherein the devices comprise devices with different functions.

5. The multi-chip package of claim 1, wherein:
at least one of the devices comprises a processor; and
at least one of the devices comprises a memory device.

6. A multi-chin package (MCP), comprising:
a plurality of memory devices;
a first internal voltage generator located on at least one of the memory devices and designed to generate a first voltage signal from a voltage signal supplied to an external pad of the MCP;
an interconnect structure spanning the plurality of memory devices and allowing the first voltage signal to be shared between the plurality of memory devices; and
a switch on at least one of the memory devices allowing selective coupling of one or more traces to the interconnect structure.

7. The multi-chip package of claim 6, further comprising:
control logic to generate a control signal to disconnect the one or more traces for one of the memory devices from the interconnect structure when the one memory device is not being accessed.

8. The multi-chip package of claim 6, wherein:
each memory device has an internal voltage generator with a capacitor to maintain a voltage generated thereby; and
the interconnect structure forms a parallel connection between the capacitors resulting in a summing of the corresponding capacitance.

9. The multi-chip package of claim 6, wherein at least two of the memory devices are dynamic random access memory (DRAM) devices.

10. The multi-chip package of claim 9, wherein the internal voltage generator generates a Voltage Bit Line High (VBLH) voltage.

11. The multi-chip package of claim 6, wherein:
at least one of the memory devices comprises a dynamic memory device; and
at least one of the memory devices comprises a static memory device.

12. A method, comprising:
generating a voltage with a circuit internal to a first device of a multi-chip package (MCP);
providing the generated voltage to a second device of the MCP via an interconnect structure that spans the first and second devices; and,
selectively coupling one or more traces to the interconnect structure.

13. The method of claim 12, wherein selectively coupling one or more traces to the interconnect structure comprises generating a control signal to control a switch to disconnect the one or more traces for one of the devices from the interconnect structure when the one device is not selected.

14. The method of claim 12, comprising:
generating a voltage with a circuit internal to each of the first and second devices, each device having an internal voltage generator with a capacitor to maintain a voltage generated thereby; and
connecting the capacitors in parallel via the interconnect structure resulting in a summing of the corresponding capacitance.

15. The method of claim 12, wherein the first and second devices comprise devices with different functions.

16. The method of claim 12, wherein:
the first device comprises a processor; and
the second device comprises a memory device.

17. The method of claim 12, wherein:
the first and second device comprise dynamic random access memory (DRAM) devices; and
the generated voltage comprises a VBLH voltage.

* * * * *